(12) United States Patent
Duran et al.

(10) Patent No.: US 8,541,325 B2
(45) Date of Patent: Sep. 24, 2013

(54) LOW EXPANSIVITY, HIGH TRANSMISSION TITANIA DOPED SILICA GLASS

(75) Inventors: Carlos Duran, Ottawa (CA); Kenneth Edward Hrdina, Horseheads, NY (US); Michael A Mueller, Roth (DE)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 13/028,472

(22) Filed: Feb. 16, 2011

(65) Prior Publication Data

US 2011/0207592 A1 Aug. 25, 2011

Related U.S. Application Data

(60) Provisional application No. 61/307,984, filed on Feb. 25, 2010.

(51) Int. Cl.
*C03C 3/06* (2006.01)

(52) U.S. Cl.
USPC .......................................................... 501/54

(58) Field of Classification Search
USPC .................................... 501/53, 54, 55, 56, 57
See application file for complete search history.

(56) References Cited

U.S. PATENT DOCUMENTS

| | | | |
|---|---|---|---|
| 7,981,824 B2* | 7/2011 | Englisch et al. | 501/54 |
| 8,093,165 B2* | 1/2012 | Koike et al. | 501/54 |
| 2006/0179879 A1 | 8/2006 | Ellison et al. | |
| 2007/0042893 A1* | 2/2007 | Koike et al. | 501/54 |
| 2010/0028787 A1 | 2/2010 | Koike et al. | |

FOREIGN PATENT DOCUMENTS

| | | |
|---|---|---|
| WO | 2006004169 A1 | 1/2006 |
| WO | 2009107847 A1 | 9/2009 |
| WO | 2009107870 A1 | 9/2009 |
| WO | 2009116690 A1 | 9/2009 |
| WO | WO/2009/107870 * | 9/2009 |

OTHER PUBLICATIONS

EP11155920.9 Search Report.

* cited by examiner

*Primary Examiner* — Noah Wiese
(74) *Attorney, Agent, or Firm* — Kevin L Bray; Walter M Douglas

(57) ABSTRACT

In one embodiment the present disclosure is directed to a silica-titania glass with an internal transmission of >90%/cm at wavelengths from 340 nm to 840 nm. In another embodiment the internal transmission is >93%/cm at wavelengths from 340 nm to 840 nm. In a further embodiment the internal transmission is >95%/cm at wavelengths from 340 nm to 840 nm. In another embodiment the disclosure is directed to a silica-titania glass with an overall transmission through an optic made of the glass is >84% at wavelengths from 340 nm to 840 nm. In another embodiment overall transmission through an optic made of the glass is >86% at wavelengths from 340 nm to 840 nm. In a further embodiment the overall transmission through an optic made of the glass is >88% at wavelengths from 330 nm to 840 nm. In a further embodiment the silica-titania glass has a $Ti^{+3}$ concentration level $[Ti^{3+}]$ less than 3 ppm by weight.

15 Claims, 4 Drawing Sheets

LOW EXPANSIVITY, HIGH TRANSMISSION TITANIA DOPED SILICA GLASS

PRIORITY

This application claims the priority of the U.S. Provisional Patent Application No. 61/307,984 titled "Low Expansivity, High Transmission Titania Doped Silica Glass" that was filed Feb. 25, 2010 in the name of inventors Carlos Duran, Kenneth E, Hrdina and Michael A. Mueller.

FIELD

The disclosure is directed to titania doped silica glasses having improved transmission and a method of making same.

BACKGROUND

Low thermal expansion titania doped fused silica glasses (hereinafter silica-titania glasses) frequently can have a brownish appearance (due to the presence of $Ti^{+3}$) and are not known for high transmission. However, there exists a need for low thermal expansion silica-titania glass with improved transmission for uses such as Imprint Microlithography.

While low expansion silica-titania glasses such as ULE® Glass (Corning Incorporated) have a low thermal expansion behavior that can be tailored, the thermal expansion behavior changes with temperatures to values that are undesirable for certain products and applications. For example, it is desirable that EUVL (extreme ultraviolet lithography) reflective optics and masks experience minimum distortion during their use, the use temperatures typically being in the range from 20° C. to 80° C. or higher. If the expansivity curve for the glass used to EUVL masks and optics could be made flatter there would be less in-use distortion in the masks and lens elements. EUVL system designers need to carefully budget thermal distortions in order for the lithography system to remain at the specified performance level as it heats up during a production run. The present disclosure identifies silica-titania glass that has improved expansivity (a flatter expansivity curve) and also has improved transmission characteristics. This glass enables the system designers to make EUVL systems with higher throughput, better overlay and resolution.

At the present time the process of making large boules of silica-titania glass can result in a glass where the CTE variation across the boule ranges from 3 to 10 ppb/° K. In addition, the absolute CTE of such glasses can only be controlled to +/−3-5 ppb/° K. As a result, glass removed from various parts of a boule can have some CTE variation. The present disclosure discloses a means of adjusting the absolute CTE via a change in the rate of anneal which simultaneously leads to improved transmission properties as well as an adjustment to the absolute CTE.

SUMMARY

The present disclosure is directed to a silica-titania glass with an internal transmission of >90%/cm over the entire range of 340 mm to 840 mm. In another embodiment the internal transmission is >93%/cm over the entire range of 340 mm to 840 mm. In a further embodiment the internal transmission is >95%/cm over the entire range of at wavelengths from 340 nm to 840 nm.

In another embodiment the disclosure is directed to a silica-titania glass with an overall transmission through an optic made of the glass is >84% at wavelengths from 310 nm to 840 nm. In one embodiment the overall transmission though an optic made of the glass is greater than >86% at wavelengths from 310 nm to 840 nm. In a further embodiment the overall transmission though an optic made of the glass is greater than >88% at wavelengths from 310 nm to 840 nm.

In another embodiment the silica-titania glass has a $Ti^{+3}$ concentration level $[Ti^{3+}]$ less than 3 ppm by weight.

In an additional embodiment the silica-titania glass has a hydrogen concentration level $[H_2]$ below $2\times10^{17}$ molecules/$cm^3$. In another embodiment the hydrogen concentration level $[H_2]$ is less than $2\times10^{16}$ molecules/$cm^3$. In a further embodiment the hydrogen concentration level $[H_2]$ is less than $2\times10^{15}$ molecules/$cm^3$.

The present disclosure is also directed to a method of heat treating (annealing) the fused silica-titania glass at temperatures between 300° C. and 1200° C. in air, inert gas or other non-$H_2$-containing environment for a time in the range of 1 day to 100 days in order to improve transmission, adjust the CTE to desired levels, and adjust the thermal expansivity of the glass. Annealing, as described herein, is carried out in an environment selected from the group consisting of air, oxygen, $N_2$, or argon, or mixtures thereof, and is used to produce a silica-titania glass having the transmission properties, $[H_2]$ and/or $[Ti^{3+}]$ levels described herein.

The silica-titania glass described herein is resistant to transmission loss and dimensional changes caused by irradiation. The glass has a fictive temperature ($T_F$) less than 900° C. in combination with greater than 600 ppm [OH] by weight, low $[H_2]$ levels as described herein, low $[Ti^{3+}]$ levels as described herein, and high internal transmission values. In one embodiment $T_F$ is less than 890° C. in combination with greater than 600 ppm [OH], low $[H_2]$ levels as described herein, low $[Ti^{3+}]$ levels as described herein, and high internal transmission values. In another embodiment $T_F$ is less than 880° C., in combination with greater than 600 ppm [OH], low $[H_2]$ levels as described herein, low $[Ti^{3+}]$ levels as described herein, and high internal transmission values. The silica-titania glasses having these properties have a titania content $TiO_2$ in the range of 7 wt % to 10 wt %. In one embodiment the titania content $TiO_2$ is in the range of 7.5 wt % to 8.5 wt %. The silica-titania glasses have low striae that allow the fabrication of imprint masks with low roughness. In one embodiment the silica-titania glass of the disclosure has expansivity slope at 20° C. of less than 1.5 ppb/° $K^2$. In a further embodiment the expansivity slope at 20° C. is less than 1.4 ppb/° $K^2$. In another embodiment the e expansivity slope at 20° C. is less than 1.2 ppb/° $K^2$.

DETAILED DESCRIPTION

In the present disclosure it has been determined that the structure of silica-titania glass, for example without limitation ULE® glass, can be changed by altering the annealing cycle of the glass. It has been found that changing the annealing schedule for a silica-titania glass can result in significant changes in the fictive temperature ($T_F$) of the silica-titania glass. The present disclosure identifies that a slower annealing cycle is a means for improving the expansivity of silica-titania glass, and additionally as a means of adjusting the glass's CTE to meet a targeted value. While US2006/0179879 disclosed doping and annealing as a method of adjusting the expansivity in titania doped silica glasses, the present disclosure goes beyond US2006/0179879 and identifies a glass with many improvements such as improved expansivity, improved transmission, less [$Ti^{3+}$] ions in the glass, and controllable CTE crossover to less than 5° C.; and a method for achieving such improvements.

Figure 1:
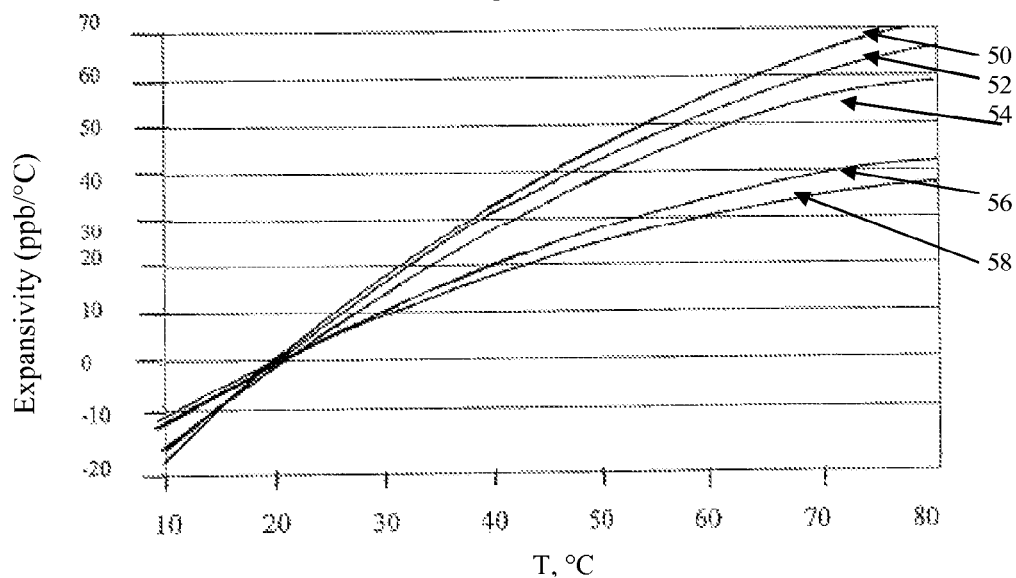
FIG. 1 is a graph of expansivity versus temperature for a silica-titania glass whose $TiO_2$ concentration was nominally 7.6 wt %, and whose expansivity was adjusted by changing the structure of the glass via the anneal cycle; the expansivity curves having been shifted vertically by the CTE shift amounts illustrated in FIG. 3.

FIG. 1 identifies glasses whose $T_F$ values were adjusted by adjusting the annealing cycle. FIG. 1 compares the change in expansivity with temperature for a given glass composition of nominally 7.6 wt. % $TiO_2$. The plot is used to compare the change in slope for each different $T_F$ obtained. The crossover temperature $T_{zc}$ (the temperature at which the expansivity is zero ppb/° C. was adjusted to 20° C. for this Figure. FIG. 1 demonstrates improvements in expansivity over the prior standard silica-titania glass (represented by numeral 54), with the improvements summarized in Table 1.

TABLE 1

| FIG. 1 Numeral | Nominal $T_F$ (FIG. 3 numeral) | Expansivity Improvement | | |
|---|---|---|---|---|
| | | 20-80° C., P-V % | 20-50° C., P-V % | Slope at 20-80° C. % |
| 58 | 860 | 36 | 29 | 24 |
| 56 | 871 | 29 | 23 | 19 |
| 54 | 893 (standard anneal, 10) | 0 | 0 | 0 |
| 52 | 913 | −12 | −9 | −7 |
| 50 | 941 | −20 | −16 | −13 |

P-V = peak-to-valley (or high-low) temperature range of 20-80° C. or 20-50° C.

The percent improvement in expansivity is dependent on the temperature change that has taken place in the glass Improvements between 0 and 36% are identified for the given $T_F$ compared with the ULE glass reference annealed using the standard anneal 10. Based on the results shown in Table 1 and FIG. 1, further improvements in expansivity can be expected as $T_F$ is lowered even further. However, the drawback is that lower $T_F$ requires longer and longer anneal times. The expansivity curves for the glasses illustrated in FIG. 1 were shifted vertically by the CTE amounts shown in FIG. 3 where numeral 10 represents the standard annealing cycle described herein; numerals 11, 13 and 15 represent longer annealing times as described herein, and numerals 12, 14 and 16 represent shorter annealing times. Hence, FIG. 1, numeral 58 represents a glass annealed for longer time than the standard cycle and numeral 50 represents a glass annealed for a shorter time than the standard annealing cycle.

Figure 2:
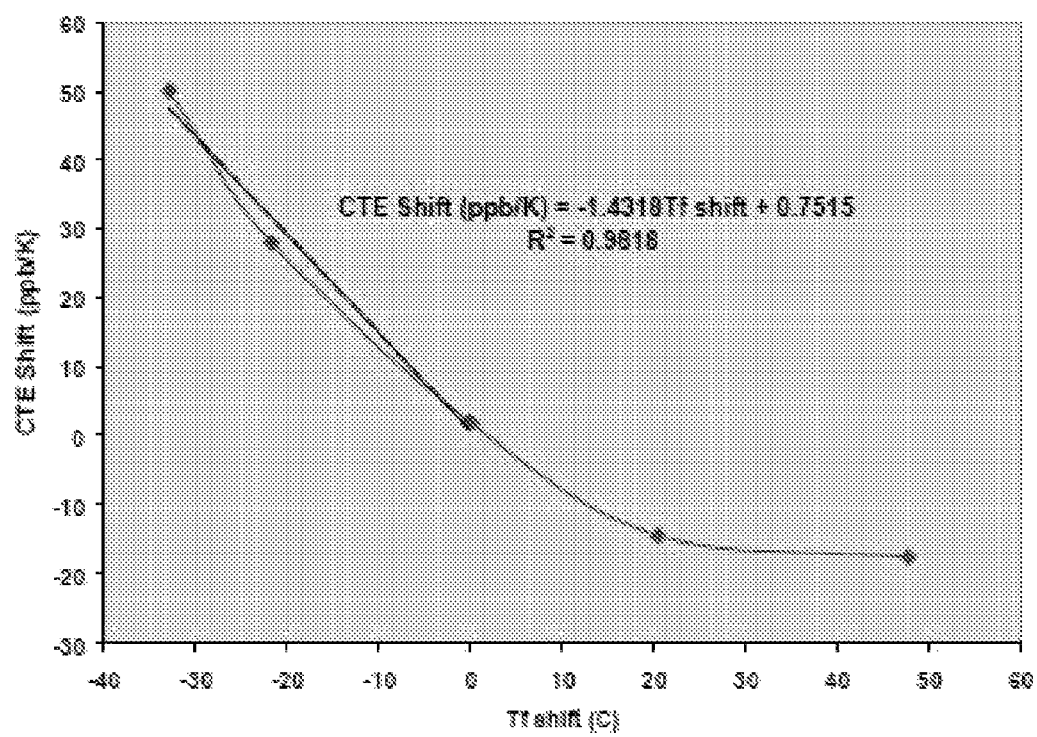
FIG. 2 is a graph illustrating that the zero cross-over temperature, $T_{zc}$, of silica-titania glass can be shifted by changing the Fictive Temperature, $T_F$, of the glass.
Figure 3:
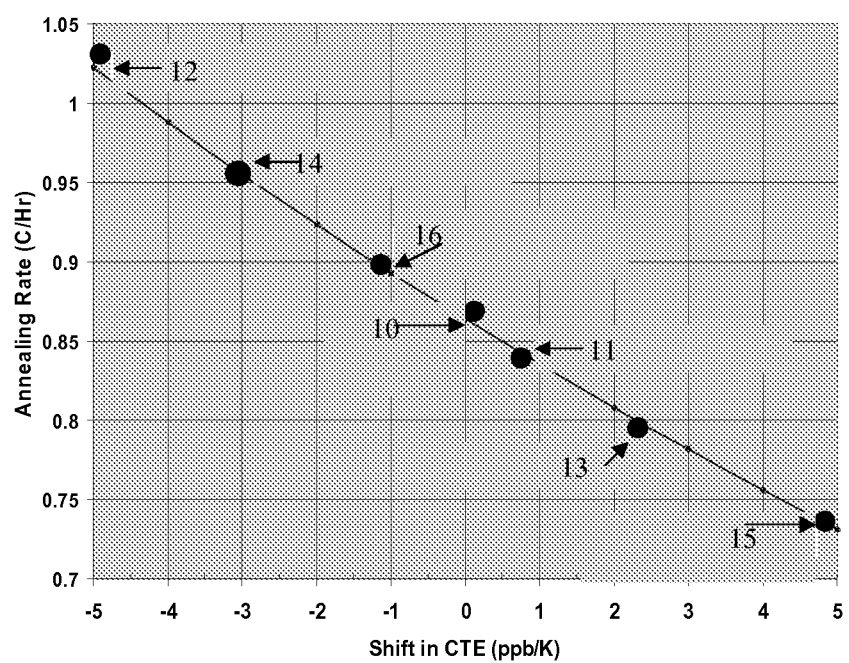
FIG. 3 is a graph illustrating that different annealing procedures will change the $T_{zc}$ for a titania doped fused silica glass with nominally 7.6 wt % $TiO_2$ that was annealed and cooled at 0.87° C./Hr.

U.S. patent application Ser. No. 12/856,728 filed Aug. 16, 2010 teaches a method by which the CTE zero crossover temperature in a silica-titania glass, for example without limitation, ULE Glass, can be obtained, and the method further identified glass with adjustable zero crossover temperatures. FIG. 2 of this application illustrates the exact relationship between the shifts in CTE for a given shift in the $T_F$. Large tuning is possible for the shifts in the $T_F$ by varying the annealing schedule. For example, FIG. 3 of this application illustrates how an annealing schedule as described herein was adjusted to change the CTE by +/−5 ppb/° C. for a glass (10) relative to a glass thus is nominally cooled a rate of 0.87° C./Hr through the critical temperature regime of approximately 990° C. to 850° C. The conditions of the anneal process used to produce the glass represented by numeral 10 in FIG. 3 are:

(1) ramping the temperature from 25° C. to 990° C. at a rate of 50° C./hour;

(2) holding the temperature at 990° C. for 100 hours;

(3) after the 100 hour hold, lowering the temperature from 990° C. to 850° C. at a rate of 0.87/hour; and (4) lowering the temperature from 850° C. to 25° C. at a rate of 25° C./hour.

In FIG. 3 the numerals 12-14 represent the annealing conditions, summarized below in Table 1, which are relative to the glass 10 that was annealed according to the foregoing conditions. For the standard conditions the total anneal time from start to finish is in the approximate range of range of 220-250 hours.

TABLE 2

| Numeral in FIG. 3 | Annealing Conditions, |
|---|---|
| 10 | Glass 10 anneal conditions, 100% of time |
| 12 | 29.5 hours less, 88% of glass 10 time |
| 14 | 18.3 hours less, 92% of glass 10 time |
| 16 | 6.3 hours less, 97% of glass 10 time |
| 11 | 6.5 hours more, 103% of glass 10 time |
| 13 | 20 hours more, 108% of glass 10 time |
| 15 | 34.6 hours more, 114% of glass 10 time |

Figure 4:
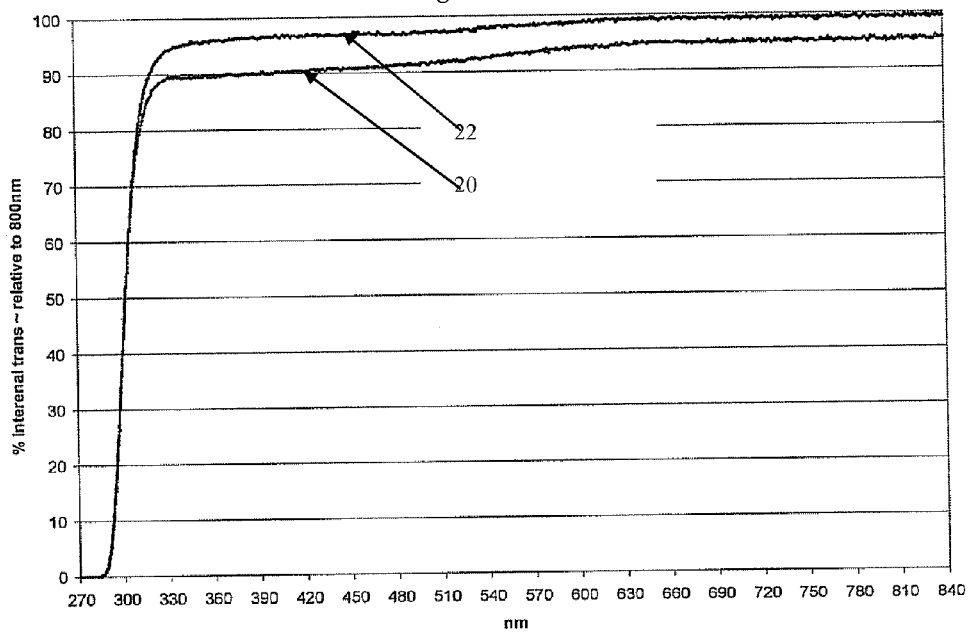
FIG. 4 is a graph illustrating the impact of a heat treatment and showing improved internal transmission in sample of nominal 7.3 wt % silica-titania glass.

The present disclosure also results in a glass with improved optical transmission. Carson and Mauer, "Optical Attenuation in Titania-Silica Glasses," J. Non-Crystalline Solids, Vol. 11 (1973), pages 368-380, identified [$Ti^{3+}$] as a light absorber and further identified $H_2$ removal of [$Ti^{3+}$] as a means of improving optical transmission. The $H_2$ removal process is a diffusion process. The current disclosure illustrates that longer annealing times are beneficial for improving transmission if the annealing is carried out in an atmospheres having a low hydrogen content (as $H_2$) from any source (for example, water vapor in the annealing atmosphere). In one embodiment the $H_2$ content is less than 10%. In another embodiment the $H_2$ content is less than 1%. In another embodiment the $H_2$ content is less than 0.01%. For example, FIG. 4 shows an internal transmission improvement of approximately 5% in the wavelength range of 330 nm to 840 nm for a glass in which the [$H_2$] was reduced from $5.6 \times 10^{17}$ molecule/cm$^3$ to less than $0.1 \times 10^{17}$ molecules/cm$^3$ by heat treating the glass for 400 hours at 950° C. in a flowing dry nitrogen atmosphere containing less then 1% $H_2O$. The annealing conditions for this particular glass were:

(1) ramping the temperature from 25° C. to 950° C. at a rate of 50° C./hour;

(2) holding the temperature at 950° C. for 400 hours in flowing nitrogen;

(3) after the 400 hour hold, lowering the temperature from 980° C. to 850° C. at a rate of 3° C./hour; and (4) lowering the temperature from 850° C. to 25° C. at a rate of 25° C./hour.

The exact time for the hold is also dependent on the size of the glass piece being annealed.

The conditions above were used for a large glass boule having a diameter of approximately 150 cm and a thickness of approximately 20 cm. For smaller glass article articles, for example, an article 16 cm in diameter and 4 cm thick, the anneal hold time can be reduced to 100 hours or less. The fictive temperature $T_F$ of this glass can be adjusted according to the method described in the foregoing paragraphs.

Figure 5:
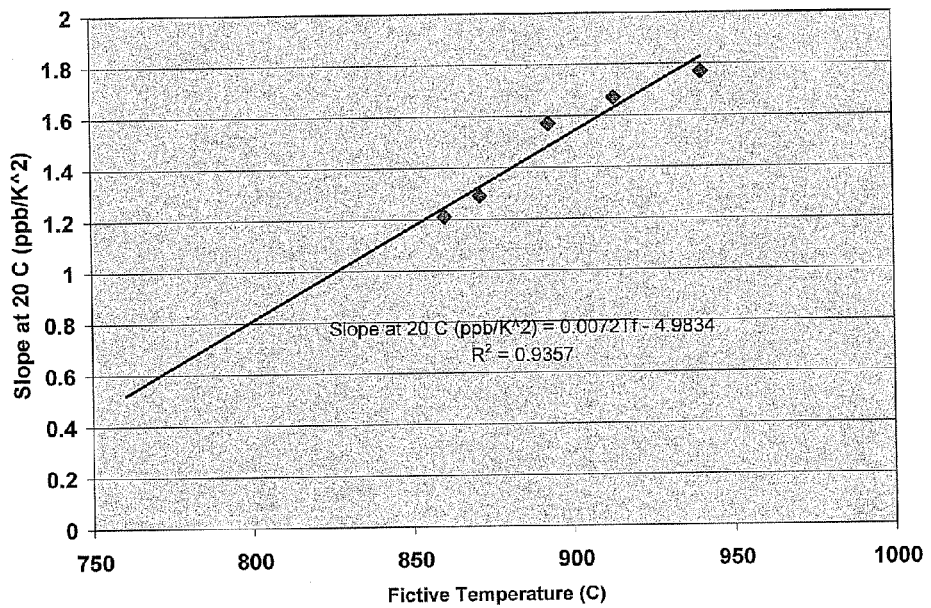
FIG. 5 is a graph illustrating the impact of $T_F$ on slope at 20° C. of an expansivity plot showing how the slope improves as the $T_F$ decreases in an almost linear fashion.

FIG. 5 is a graph of the slope, at 20° C., of the expansivity for glasses with different fictive temperatures ($T_F$). The data shown in FIG. 5 shows an essentially linear relationship between the slope and the $T_F$ of the glass. In addition, the data clearly indicates that the expansivity improves as the $T_F$ decreases, and it also suggests that the improvement is almost linear in nature. Consequently, the slope or degree of improvement can be predicted by the fictive temperature in the glass, regardless as to how that $T_F$ was obtained; for example, by the slower annealing rates disclosed herein. It is the addition of more OH species to the glass or the inclusion of other dopants such as F may also vary $T_F$ and hence the expansivity.

Although the discussion above has been framed in terms of achieving a desired $T_F$ by means of changing the cooling rate in a constant rate annealing cycle, the disclosure equally applies to glasses processed using different types of annealing cycles. For example, a variable-rate cycle may be used with the purpose reaching the desired $T_F$ in a shorter time. In addition, it may be desirable to use an isothermal hold at some point during the annealing cycle. Preferably, the isothermal hold would take place towards the end of the annealing cycle in order to obtain a more uniform distribution of $T_F$, and to ensure consistency of $T_F$ versus changes in the structural relaxation dynamics of the glass, as they can be affected by factors such as glass OH content. Annealing schedules can include a final (or consisting of an) isothermal hold may also be advantageous from a manufacturing point of view, as they can be more easily managed in order to predictably tune the expansion properties of the silica-titania glass.

Figure 6:
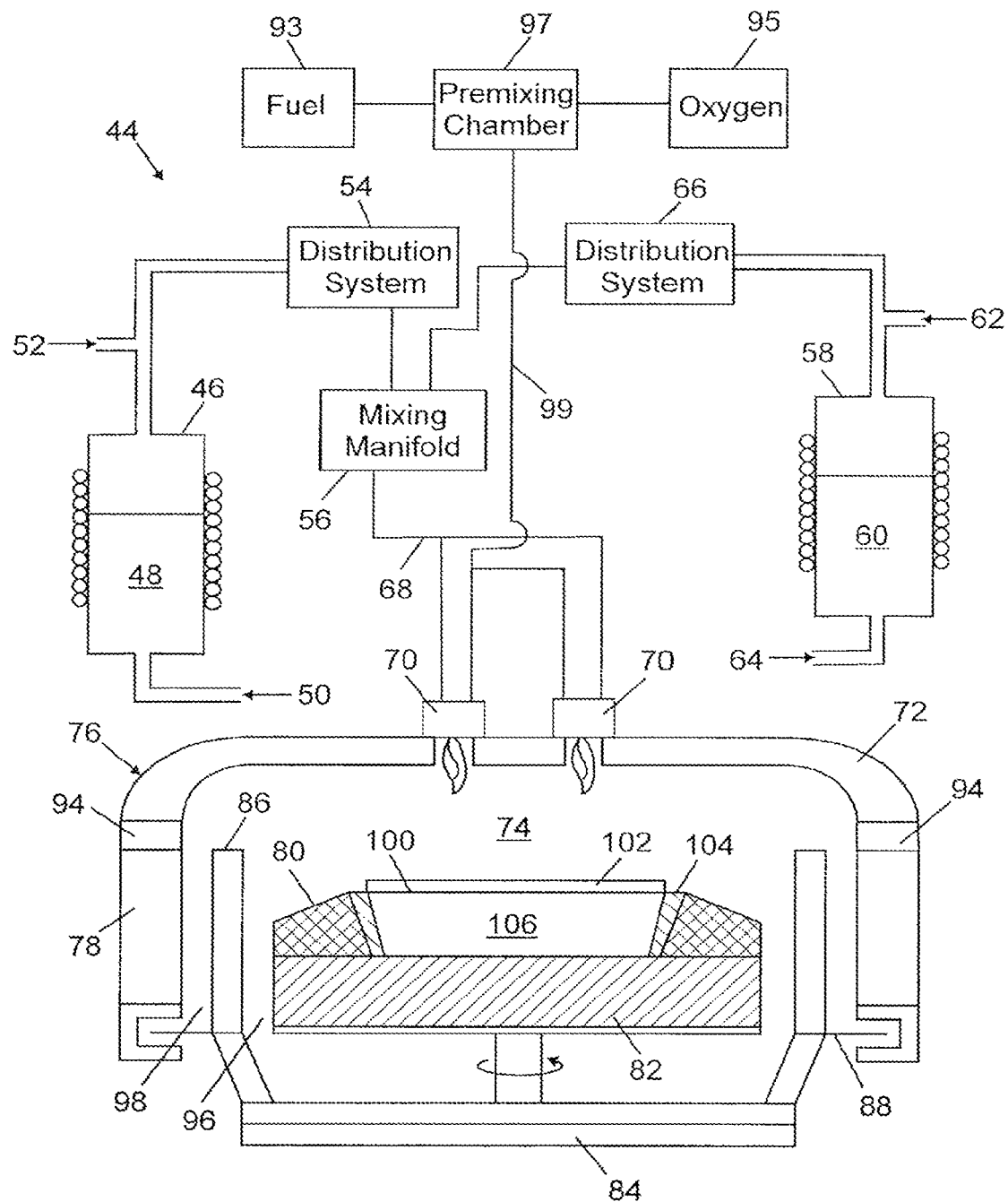
FIG. 6 depicts an apparatus for making silica-titania glass by the direct method.

FIG. 6 illustrates an apparatus for making, depositing and consolidating a silica-titania soot in a vessel, wherein the dashed arrows 110 designate the introduction of a gaseous atmosphere containing water vapor according to the present disclosure. Using this apparatus the soot can either be (a) collected and consolidation in one step (the direct method) or (b) collected in a first step and consolidated in a second step. The apparatus illustrated in FIG. 6 is generally used to form boules having a diameter in the range of 0.2 meter to 2 meters, or larger and a thickness in the range of 10-30 cm. As an example of the direct method, a source 46 of a silica precursor 48 and a source 58 of a titania precursor 60 are provided. The silica precursor 48 and titania precursor 60 are typically siloxanes, alkoxides, and tetrachlorides. One particularly commonly used silica precursor is OMCTS. One particularly commonly used titania precursor is Ti(OPri)$_4$. The sources 46, 58 may be vaporizers, evaporation tanks, or other equipment suitable for converting the precursors 48, 60 into vapor form. A carrier gas 50, such as nitrogen, is introduced at or near the base of source 46. The carrier gas 50 entrains the vapors of the silica precursor 48 and passes through a distribution system 54 to a mixing manifold 56. A by-pass stream of carrier gas is introduced at 52 to prevent saturation of the vaporous silica precursor stream. A stream of inert gas 62, e.g., nitrogen, can be brought into contact with the vaporous titania precursor to prevent saturation of the vapors. An inert carrier gas 64, e.g., nitrogen, entrains the titania precursor 60 vapors and carries the vapors through a distribution system 66 to the mixing manifold 56, where they are mixed with the silica precursor 48 vapors. Alternatively, the titania precursor 60 and the silica precursor 48 may be delivered to the mixing manifold 56 in liquid form. The mixture in the mixing manifold 56 passes through heated fume lines 68 to the burners 70 mounted on the furnace crown 72. In this illustration, two burners 70 are shown. However, more than two burners can be used to allow for better heat control and distribution of material across the deposition cavity 74. The furnace 76 may have rotation and oscillation capabilities and may include a stationary wall 78, which supports the crown 72. A containment vessel 80 is disposed within the stationary wall 78. The containment vessel 80 includes a base 82 which is supported for rotation and which also oscillates through its attachment to an oscillation table 84. The containment vessel 80 is surrounded by an air flow wall 86 which is mounted on the oscillation table 84. A motion accommodating seal 88 is formed between the stationary wall 78 and the containment vessel 80. The deposition cavity 74 is vented by a plurality of draft ports 94 formed at the top of the stationary wall 78. The draft ports 94 are connected to a suitable exhaust system (not shown) by ducting which creates a negative pressure in the deposition cavity 74 with respect to ambient pressure. Fuel 93 and oxygen 95 are premixed in the premixing chamber 97 and then transferred to the burners 70 through fume lines 99. The burners 70 ignite the fuel/oxygen mixture to produce a flame which heats the deposition cavity 74. The vaporous reactants injected into the burners 70 exit the burners 70 where they react and form titania-doped silica particles via flame hydrolysis or pyrolysis. The soot is directed downwardly and deposited on a planar surface 100, as shown at 102. The planar surface 100 may be provided by filling the liner 104 of the containment vessel 80 with cleaned cullet 106, although other means of providing a planar surface, such as a glass plate, may also be used. As the soot is deposited, the containment vessel 80, and hence the planar surface 100, is rotated and oscillated through the base 82 to improve index homogeneity of the silica. During soot deposition, the furnace 76 is drafted with ambient air. The temperature of the deposition cavity 74 is monitored and held at desired processing temperatures by adjusting the vertical position of the containment vessel 80. In the direct process the temperature is maintained at a consolidation temperature so that the silica-titania particles are formed and consolidate into glass substantially simultaneously. Such time is less generally less than three seconds and typically less than 2 seconds. In accordance with the present disclosure, when a high [OH] concentration in the glass is desired, a partial pressure of water vapor can be maintained in the apparatus by injection of a gas containing a selected amount of water vapor at the top of the part of the furnace of FIG. 6 as illustrated by dashed arrows 110. After the glass is consolidated, it can be annealed in the same furnace according to an annealing cycle described herein or the glass can be removed from the furnace and annealed at a later time.

While typical embodiments have been set forth for the purpose of illustration, the foregoing description should not be deemed to be a limitation on the scope of the disclosure. Accordingly, various modifications, adaptations, and alternatives may occur to one skilled in the art without departing from the spirit and scope of the present disclosure.

We claim:

1. A silica-titania glass consisting of 7-10 wt. % titania and 90-93 wt. % silica and said glass has an internal transmission of greater than 95%/cm over the wavelength range of 340 nm to 840 nm, a fictive temperature less than 900° C. in combination with greater than 600 ppm [OH] by weight, and said glass having a hydrogen ($H_2$) concentration of less than $2 \times 10^{17}$ hydrogen molecules/cm$^3$.

2. The silica-titania glass according to claim 1, wherein said glass consists of 7.5-8.5 wt. % titania and 91.5-92.5 wt. % silica.

3. The silica-titania glass according to claim 1, wherein said glass has an expansivity slope at 20° C. of less than 1.5 ppb/° K$^2$.

4. The silica-titania glass according to claim 2, wherein said glass has an expansivity slope at 20° C. of less than 1.5 ppb/° K$^2$.

5. The silica-titania glass according to claim 1, wherein said glass has an expansivity slope at 20° C. of less than 1.2 ppb/° K$^2$.

6. The silica-titania glass according to claim 2, wherein said glass has an expansivity slope at 20° C. of less than 1.2 ppb/° K$^2$.

7. The silica-titania glass according to claim 1, wherein the silica-titania glass has a Ti$^{+3}$ concentration level [Ti$^{3+}$] less than 3 ppm by weight.

8. The silica-titania glass according to claim 2, wherein the silica-titania glass has a Ti$^{+3}$ concentration level [Ti$^{3+}$] less than 3 ppm by weight.

9. The silica-titania glass according to claim 1, wherein said glass has an internal transmission of greater than 95%/cm in the wavelength range of 330 nm to 840 nm.

10. The silica-titania glass according to claim 2, wherein said glass has an internal transmission of greater than 95%/cm in the wavelength range of 330 nm to 840 nm.

11. The silica-titania glass according to claim 2, wherein said glass has a fictive temperature of less than 890° C. in combination with greater than 600 ppm [OH] by weight.

12. The silica-titania glass according to claim 2, wherein said glass has a fictive temperature of less than 880° C. in combination with greater than 600 ppm [OH] by weight.

13. A silica-titania glass consisting of 7-10 wt. % titania and 90-93 wt. % silica and said glass has an internal transmission of greater than 95%/cm in the wavelength range of 340 nm to 840 nm, a fictive temperature less than 900° C. in combination with greater than 600 ppm a [OH] by weight, and said glass having a hydrogen ($H_2$) concentration of less than $2 \times 10^{16}$ hydrogen molecules/cm$^3$.

14. A silica-titania glass consisting of 7-10 wt. % titania and 90-93 wt. % silica and said glass has an internal transmission of greater than 95%/cm in the wavelength range of 340 nm to 840 nm, a fictive temperature less than 900° C. in combination with greater than 600 ppm [OH] by weight, and said glass having a hydrogen ($H_2$) concentration of less than $0.1 \times 10^{17}$ hydrogen molecules/cm$^3$.

15. An optic comprising the glass of claim 1.

* * * * *